United States Patent [19]
Hawks

[11] Patent Number: 5,642,046
[45] Date of Patent: Jun. 24, 1997

[54] LOW POWER MAGNETOMETER CIRCUITS REQUIRING A SINGLE SWITCHING CYCLE

[75] Inventor: Timothy J. Hawks, Palo Alto, Calif.

[73] Assignee: Magknowledge Inc., Mountain View, Calif.

[21] Appl. No.: 255,651

[22] Filed: Jun. 8, 1994

[51] Int. Cl.$^6$ .................................................. G01R 33/04
[52] U.S. Cl. ............................................................ 324/253
[58] Field of Search ........................................ 324/253, 254, 324/255, 117 R; 340/870.33; 33/361

[56] References Cited

U.S. PATENT DOCUMENTS

| | | |
|---|---|---|
| 4,314,200 | 2/1982 | Marek . |
| 4,668,100 | 5/1987 | Murakami et al. . |
| 4,851,775 | 7/1989 | Kim et al. . |
| 5,039,945 | 8/1991 | Webb .................................. 324/253 |
| 5,239,264 | 8/1993 | Hawks . |

Primary Examiner—Walter E. Snow
Attorney, Agent, or Firm—Skjerven, Morrill, MacPherson, Franklin & Friel, LLP; David W. Heid

[57] ABSTRACT

Magnetometer circuits are disclosed in which a solenoidal sensor coil including a saturable core is provided a source potential to bring the coil towards saturation, followed by deactivation of the potential to the coil. The current through the coil is sensed and the magnetic field effecting the coil may be determined based on the amount of time which is required for the current in the coil to decline from a first level to a second level. A current sensor connected to the sensor coil provides a first output signal in response to the current through the coil increasing to a first value in a first portion of an operational cycle, and provides a second output signal in response to the current through the coil decreasing to a second value. The time period between the first and second output signals from the current sensor is indicative of the magnitude of the field affecting the coil.

11 Claims, 10 Drawing Sheets

LOW POWER MAGNETOMETER CIRCUITS REQUIRING A SINGLE SWITCHING CYCLE

BACKGROUND OF THE INVENTION

1. Field of the Invention

This invention relates to devices and circuitry for measuring magnetic fields and more particularly to magnetometer circuits for measuring magnetic fields.

2. Description of Related Art

A number of different types of magnetometers are available. However, of the various types presently available, a fluxgate magnetometer is one of the more practical types for the measurement of weak static magnetic fields. Fluxgate magnetometers rely on the saturation of a magnetic core to provide a basis to measure an absolute magnetic field. The current required to bring the core into saturation is the major source of power consumption for the magnetometer. While it is possible to reduce the power consumption of traditional fluxgate magnetometer sensing techniques for low power applications by reducing the sampling or measurement time, these adaptations do pose a few significant design challenges. With the more reliable second-harmonic fluxgate detection scheme, it is not easy to simply reduce the number of excitation waveform cycles; most systems involve some degree of filtering, which requires many excitation cycles to settle. While it is easier to adapt a peak detection scheme to use only a few excitation cycles, as found in U.S. Pat. No. 4,668,100, issued May 26, 1987 to Murakami et al., peak detection fluxgate systems generally have inferior accuracy. In Murakami et al., a toroidal coil is utilized. It is much more straightforward to adapt a frequency-mode magnetometer detection scheme such as that found in U.S. Pat. No. 5,239,264, issued Aug. 24, 1993 to Timothy J. Hawks. In the Hawks patent, a solenoidal coil is used instead of the Permalloy toroidal coil described in the Murakami et al. patent. Using a simple L/R relaxation oscillator with the solenoidal coil, the magnetometer circuit has an almost instantaneous start-up time. As a direct consequence, it is quite simple to gate the oscillator on for short periods of time while retaining the ability to acquire a period of the waveform to measure the magnetic field value. This circuit still suffers from the requirement for a significant peak current to drive the sensor coil.

An earlier additional magnetometer is disclosed in U.S. Pat. No. 4,851,775 issued Jul. 25, 1989 to Kim et al. In the Kim et al. patent a solenoidal sensor coil is utilized. However, the magnetometer of Kim et al. suffers from the same disadvantages as U.S. Pat. No. 5,239,264 for low power applications.

There is a need to reduce the overall power consumption in magnetometers over that which has been available in prior art magnetometers. One of the objects of the present invention is to reduce the amount of power required to measure the magnetic field.

SUMMARY OF THE INVENTION

In accordance with the present invention a magnetometer circuit is provided which, in one embodiment, a sensor coil including a saturable core is provided a source potential to bring the coil toward a saturation point, followed by a deactivation of the potential to the coil. The current through the coil is sensed and the magnetic field affecting the coil may be determined based on the amount of time that is required for the current to the coil to decrease from a first predetermined amount to a second predetermined amount.

The current sensor provides a first output signal in response to the current through the sensor coil increasing to a first threshold level in a first portion of the cycle, and provides a second output signal in response to the current through the sensor coil decreasing to a second threshold level. The time period between these first and second output signals is indicative of the magnitude of the field affecting the coil.

In accordance with another embodiment of the present invention, a magnetometer circuit is provided in which zero cancellation is achieved. In one embodiment of the zero cancellation circuit, a first and a second state of operation are provided. In the first state of operation a first terminal of the sensor coil is alternately connected to a first source of potential and then a second source of potential and a current sensor is connected to the second terminal of the coil to measure the current through the coil. In the second state of operation, the second terminal of the coil is alternately connected to the first source potential and then the second source of potential and the current sensor is connected to the first terminal of the coil to measure the current flow through the sensor coil.

BRIEF DESCRIPTION OF THE DRAWINGS

Other objects and advantages of the invention would become apparent from a study of the specification and drawings in which:

FIG. 1b illustrates waveforms of the circuit of FIG. 1a, which are used in the explanation of the operation of the circuit of FIG. 1a;

DETAILED DESCRIPTION OF THE INVENTION

Figure 1A:
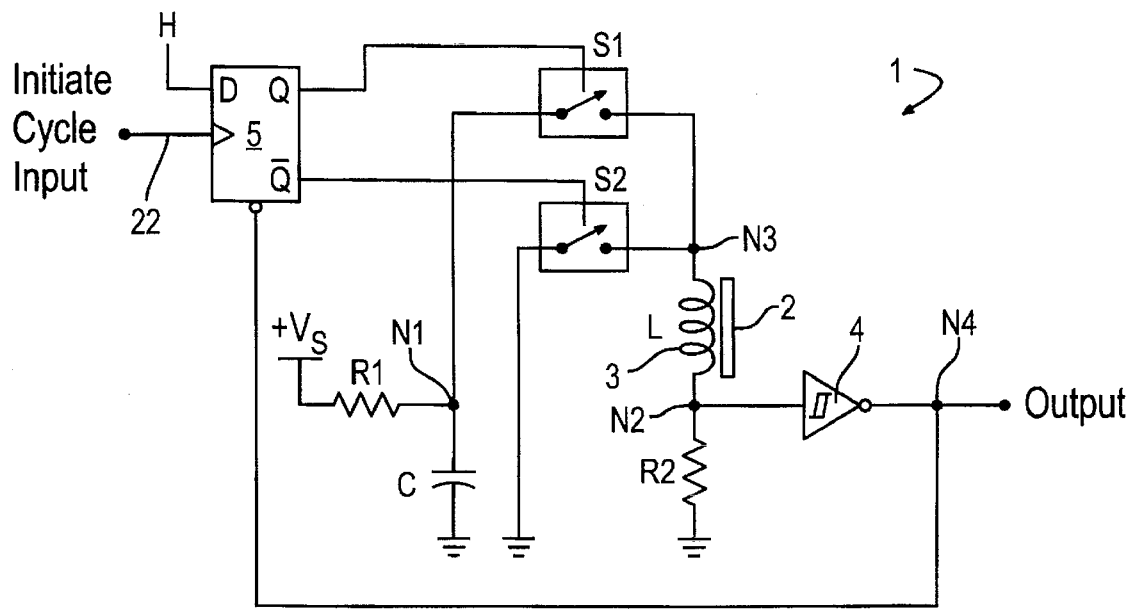
FIG. 1a is a circuit diagram of a magnetometer circuit according to one embodiment of the present invention.

As pointed out above, the current required to saturate the core in a fluxgate magnetometer is a significant source of power consumption. In accordance with the present invention, the following two basic strategies for reduction of the overall power consumption resulting from saturating the core are utilized: 1) reduction of the current required to saturate the core, and 2) reduction of the amount of time the core has to be saturated during measurement of the field. The former strategy is achieved in two different ways: first, by using magnetic core materials that saturate at lower fields, and secondly, by increasing the number of turns on the excitation coil. The present invention uses both of these techniques to achieve a significant incremental improvement over existing fluxgate technology. By using a thin amorphous metal foil core instead of a Permalloy toroid, the sensor requires a somewhat lower saturation field. With a solenoidal geometry and a single excitation/sense winding, it is economical to wind more turns of wire on the sensor core than those on a fluxgate excitation coil. The increased number of windings helps to reduce the saturation current requirement during excitation. Despite these improvements, the most significant reduction in power is achieved by the second strategy, the reduction of core saturation time during measurement. The manner in which the second strategy of power reduction is achieved is described fully below.

The low power magnetometer in accordance with the present invention not only overcomes the above-described prior art problems while sampling for a brief period, it also reduces the peak current required by the sensor. The magnetometer requires only one excitation cycle to sample the magnetic field. Additionally, all the power needed by the sensor can be supplied through a single capacitor, which reduces the peak current requirements on the power supply to a value closer to the average current.

Basic Sensor Theory

In order to understand the operation of the magnetometer circuit in accordance with the present invention, it is helpful to have simple model of the sensor behavior. For example, in magnetometer circuit 1 in FIG. 1a, sensor L is a solenoidal inductor with a core 2 of saturable high-permeability material. A typical high permeability material suitable for the core 2 is a cobalt-based amorphous metallic glass foil from Allied Signal, product number 2705M. A single winding 3 is used not only to provide the excitation signal but also to sense the changing field in the core. The total magnetic field through the magnetic core material is the sum of the external magnetic field and the field created by current flowing through coil 3. The following equation describes this relationship:

$$H = k_0 I + H_E \quad (1)$$

where H is the total magnetic field through the core material 2, $H_E$ is the external applied magnetic field that is parallel to the core material 2, and I is the current flowing through the inductor coil 3. Constant $k_0$ is a function of the physical parameters of coil 3, such as its turn density. When a high-permeability material experiences a magnetic field, it effectively amplifies this field by a large factor known as the relative permeability. For many materials this factor can be anywhere from 100 to 100,000 at the maximum point. Typically, the permeability is high for only a limited range of small fields. As the field applied to the material is increased in either direction, the permeability of the material drops off to a factor of one. This reflects the saturating characteristic of these materials. The relative permeability, as a function of the applied field, is denoted as μ(H). The voltage across the sensor coil will be a function of the change in the resulting magnetic field from the material. This can be expressed as follows:

$$V = k_1 \mu(H) \frac{dH}{dt} \quad (2)$$

where V is the voltage across the sensor coil, μ(H) is relative permeability of the core, and dH/dt is the time derivative of the applied field. The constant $k_1$ is a function of several sensor physical parameters, such as the turn density of the coil and the volume of the coil material. When the external field $H_E$ is constant (i.e. varies slowly with time), equations (1) and (2) can be combined to produce the following:

$$V = k_0 k_1 \mu(H) \frac{dI}{dt} \quad (3)$$

As with a normal inductor, the voltage is related to the time derivative of the current and can alternatively be expressed as follows:

$$V = L(H) \frac{dI}{dt} \quad (4)$$

where L(H) is defined accordingly:

$$L(H) = k_0 k_1 \mu(H) \quad (5)$$

Note that the inductance is not constant but rather a nonlinear function of the magnetic field applied to the material. Given this formalism of variable inductance, it is possible to describe the output of the magnetometer analytically as a function of the applied field. The effects of material hysteresis are not explicitly handled here. However, in the limiting case of measuring a constant field over many identical transitions, the relative permeability function does tend to converge to a repeatable value, making the above-mentioned relationships useful approximations.

The solenoidal design of sensor L has a few key advantages over its toroidal fluxgate counterpart. In general, increasing the volume of windings (a function of both the wire gauge and the number of turns) around the sensor core reduces the sensor's power consumption; if either the wire size or the number of turns is increased, the power required to bring the sensor core into saturation will be reduced. Additionally, the number of turns used in the sense winding is proportional to the output signal strength; increasing the number of sense windings can reduce the required amplification of the sensed signal. Solenoidal sensor L has a single winding 3, thus excitation and sensing are done with the same coil. For reduction of excitation power, solenoidal sensor L can accommodate more turns than an equivalent size fluxgate sensor, in which the excitation windings must be threaded through the toroid. Additionally, the increased number of turns on solenoidal sensor L will enhance the output signal strength. In many cases of prior art sensors, the number of turns in the sense and excitation windings must compete for the limited space around the fluxgate sensor core.

Magnetometer circuit 1 in FIG. 1a illustrates one embodiment of a magnetometer in accordance with the present invention and provides a vehicle for explaining the basis for the operation of the magnetometer circuit. In the magnetometer circuit of FIG. 1a, the magnetometer output is not "zero-compensated"; that is, the output for the magnetometer circuit with no external field applied is, in practice, not repeatable over temperature and component variation. Alternative embodiments described later will correct this deficiency. In magnetometer circuit 1, the output (illustrated in FIG. 1b) is a logic signal whose pulse width $t(H_E)$ changes with the magnetic field applied to the sensor L. The current through sensor L is converted to a voltage by resistor R2 and measured by the inverting Schmitt Trigger 4. Referring to FIG. 1a, energy for saturation of sensor L is provided by capacitor C, with the ground node providing a first power terminal and node N1 (at the top of capacitor C) providing a second power terminal. Node N3 is a first terminal of sensor coil L, this terminal being alternately connected between node N1 via switch S1 and to ground via switch S2. To measure the current flow through sensor L, a resistor R2 is connected between the second terminal N2 of sensor coil L and ground. The current sensor is completed by inverting Schmitt Trigger 4 having its input connected to node N2 and its output connected to Node N4. A logic high (indicated by H in FIG. 1a) is continuously applied to the D input of D flip-flop 5. To start a measurement cycle, an Initiate Cycle signal (illustrated in FIG. 1b) is applied to D flip-flop 5 via line 22. The D flip-flop 5 alternately activates analog switches S1 and S2, as described in further detail below. Capacitor C provides the energy to saturate the sensor, and it is slowly charged through resistor R1 from the positive power supply $V_S$. Alternatively, power to saturate sensor coil L could be provided by connecting a power supply directly to node N1.

Figure 1B:
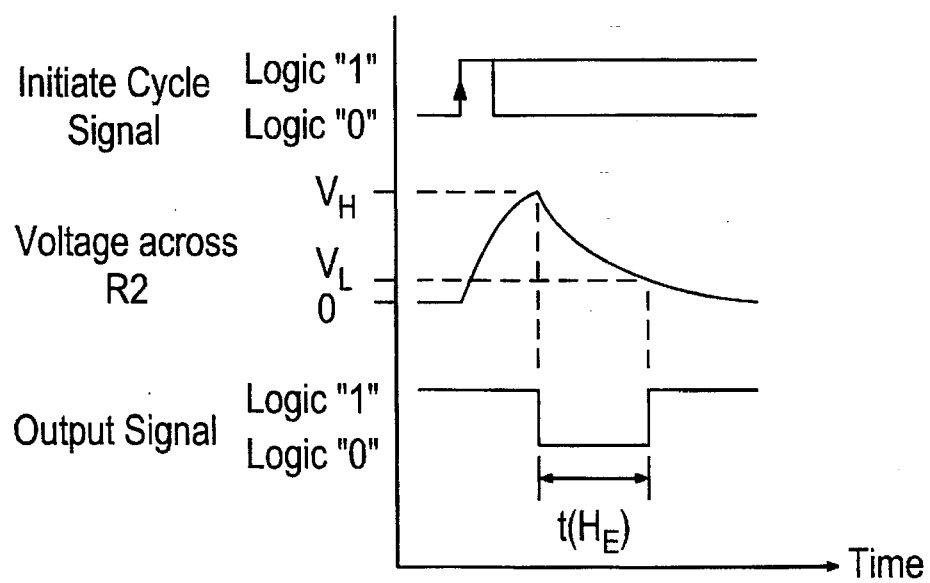

The waveforms in FIG. 1b show the process of taking one measurement of the magnetic field $H_E$. The process is initiated by a rising edge of the Initiate Cycle Signal which is applied to line 22 and sets the flip-flop 5 such that S1 is closed. In this first phase of operation, capacitor C, sensor L, and resistor R2 form an under-damped RLC circuit in which the charge on C is dumped into the sensor inductor. As the current through the sensor inductor increases, the voltage across R2 increases until it reaches the Schmitt Trigger's positive-going threshold voltage, $V_H$. At this point, the output of the Schmitt Trigger goes low and resets flip-flop 5. Switch S1 is opened and switch S2 is closed, connecting node N3 of sensor L to ground. During this second phase of the cycle, the energy stored in sensor L is discharged through R2 until the voltage across resistor R2 reaches the Schmitt Trigger's negative-going threshold, $V_L$. The output of the Schmitt Trigger then returns high, completing the output pulse. The width of the pulse in terms of the time from the falling to rising edges of the output, indicated by $t(H_E)$ in FIG. 1b, will be approximately proportional to the external magnetic field $H_E$ applied to sensor L. If the inductance of sensor L was linear, the output pulse width could be calculated as follows:

$$t = \frac{L}{R2} \ln\left(\frac{V_H}{V_L}\right) \quad (6)$$

In this case the pulse width would be proportional to the inductance of sensor L. However, due to the non-linear inductance characteristic of the sensor L, the pulse width needs to be calculated as follows:

$$t(H_E) = \frac{1}{R2} \int_{I_L}^{I_H} \frac{L(k_0 I + H_E)}{I} dI \quad (7)$$

where low and high threshold currents, $I_L$ and $I_H$, respectively, are defined accordingly:

$$I_L = V_L/R2 \quad (8)$$

$$I_H = V_H/R2 \quad (9)$$

The integral equation (7) shows how the inductance function is convolved with a hyperbolic weighting function, reflecting the fact that the sensor inductance at the start of the discharge cycle (near $I_H$) contributes less to the overall output pulse width than the inductance at the end of the discharge (near $I_L$).

Figure 3:
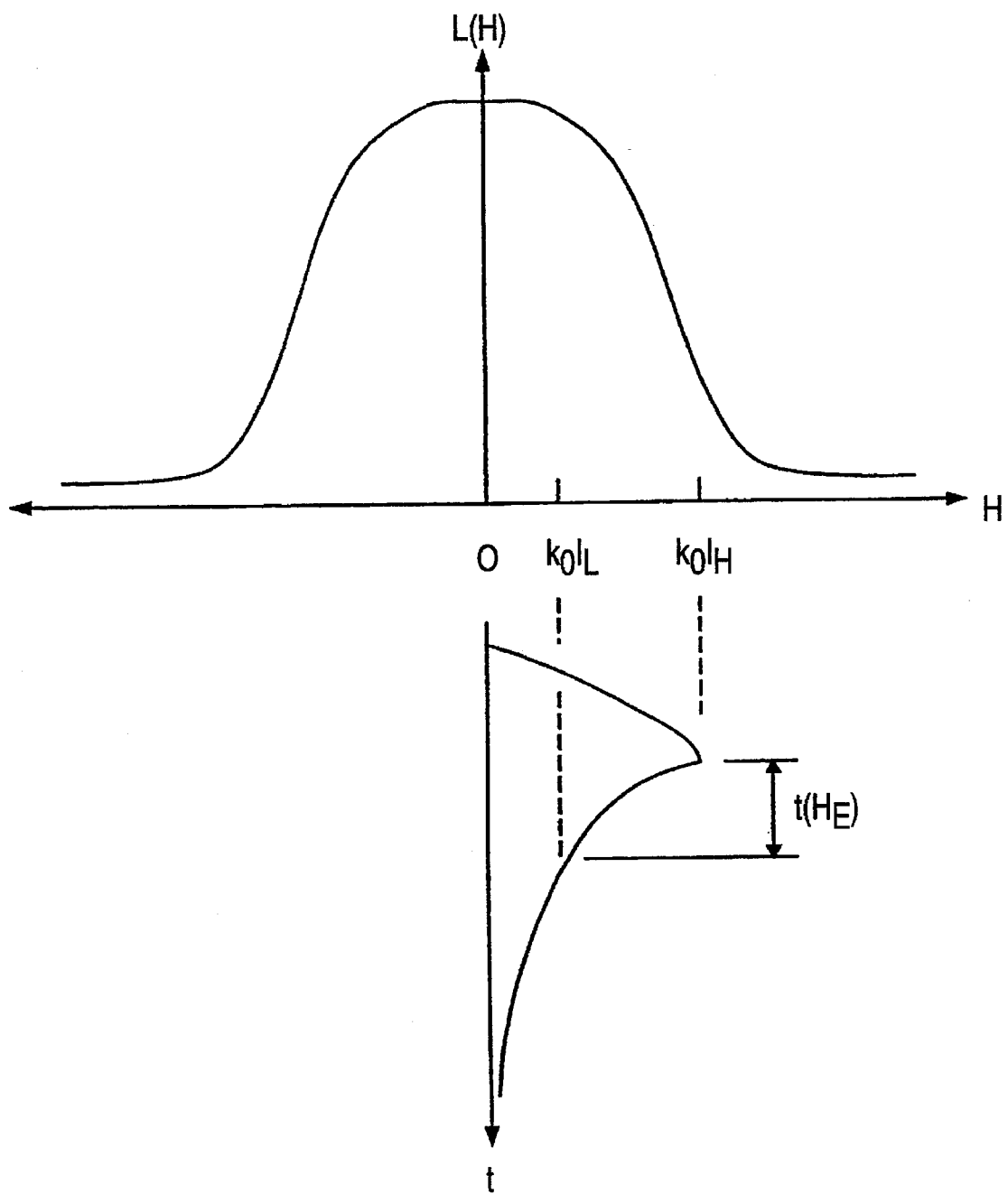
FIG. 3 illustrates additional waveforms useful in connection with the description of the present invention.

FIG. 3 illustrates how the field H over time relates to the variable sensor inductance. The operating points in FIG. 3 are shown for no external field. The external field $H_E$ will change the operating range on the inductance curve and thereby change the period of the output. An external field $H_E$ which magnetizes the sensor core in the same direction as the excitation field (produced by application of a potential to sensor L) will tend to decrease the average inductance and thus the period of the output pulse. On the inductance curve of FIG. 3, this would shift the operating points towards the right. An external field which opposes the excitation field will conversely increase the inductance and the output pulse period. The threshold currents $I_L$ and $I_H$ are determined by the threshold voltages of the Schmitt Trigger as shown in (8) and (9) respectively. These threshold values can be modified in conjunction with the physical core construction to optimize the linearity and the overall current consumption.

Note that the measured pulse width is not dependent on the capacitance of capacitor C. To a first order, the value of capacitor C has no influence on sensor L as long as it provides enough energy to reach the threshold current $I_H$. The threshold itself is determined by R2 and by the positive-going threshold $V_H$. Since typical capacitors in the required range of values of 0.1 µF to 0.47 µF (which are nominal for this circuit) have a fairly poor temperature coefficient, the circuit benefits from this immunity to capacitance variation. While somewhat dependent on the particular physical parameters of sensor L, the capacitance value of capacitor C is small enough to allow use of a compact monolithic capacitor. Capacitor C only acts as a buffer for the sensor saturation energy. The optimal capacitance value of capacitor C should probably be close to the smallest value such that sensor L will reach the upper current threshold $I_H$, given the worst-case charge on capacitor C and the worst-case external magnetic field. The value of C is best determined empirically since it is dependent on the non-linear inductance of sensor L. The capacitor will have to supply the maximum amount of charge when an external magnetic field $H_E$ keeps the sensor L from saturating. It may, however, be desirable to increase the value of C to avoid second-order problems with accuracy; if Schmitt Trigger 4 has a significant delay, a small value of capacitance C might have a significant effect on the sensor response by causing an apparent shift of the upper threshold $I_H$. A larger value of C will slow the slew rate of the current during the sensor charging phase, reducing the effect of C on the threshold $I_H$.

The peak current drawn from the power supply is programmable; it is dependent on the value of R1 that is chosen. While R1 can be made arbitrarily large to reduce the current to a trickle, it does lengthen the period needed to allow capacitor C to recharge between samples. High values of R1 allow use of power supplies with high output impedance. In the case of watch circuitry, it is possible to use the output of a capacitive voltage doubler that would not be able to drive a sensor directly. Similarly, low-power solar cells can be used to supply the charging current. In applications with different power supply characteristics, the RC network of R1 and C may be unnecessary; a power supply with sufficient available current can be directly connected to the analog switch S1. In general, the basic magnetometer circuit allows, but does not require, sensor drive current to be supplied from a capacitor. This capacitor can be charged through a resistor or any other means (such as a current source).

In the circuit of FIG. 1a, D flip-flop 5 could also be replaced by a simple set-reset latch if the Initiate Cycle signal is guaranteed to be a pulse that is shorter than the minimum charging period for the sensor inductor. These and other modifications to the original logic of magnetometer circuit 1 will be obvious to one skilled in the design of digital logic.

Figure 4A:
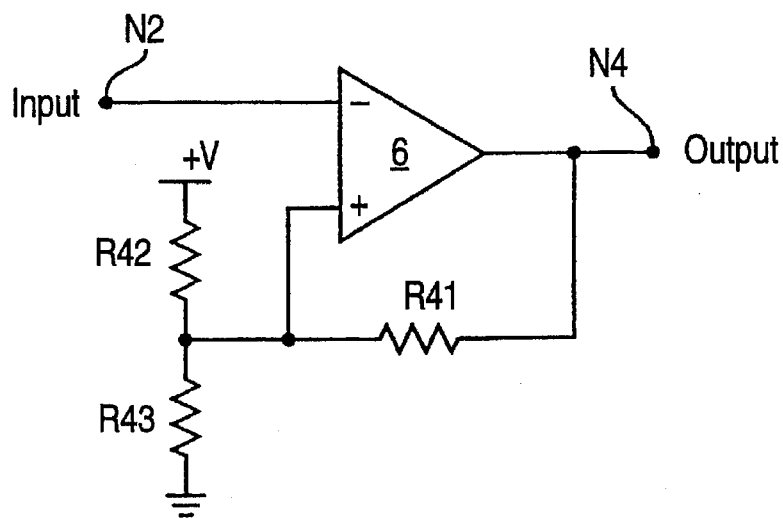
FIGS. 4a, 4b and 4c illustrate voltage sensor circuits which may be utilized in the practice of the present invention.
Figure 4B:
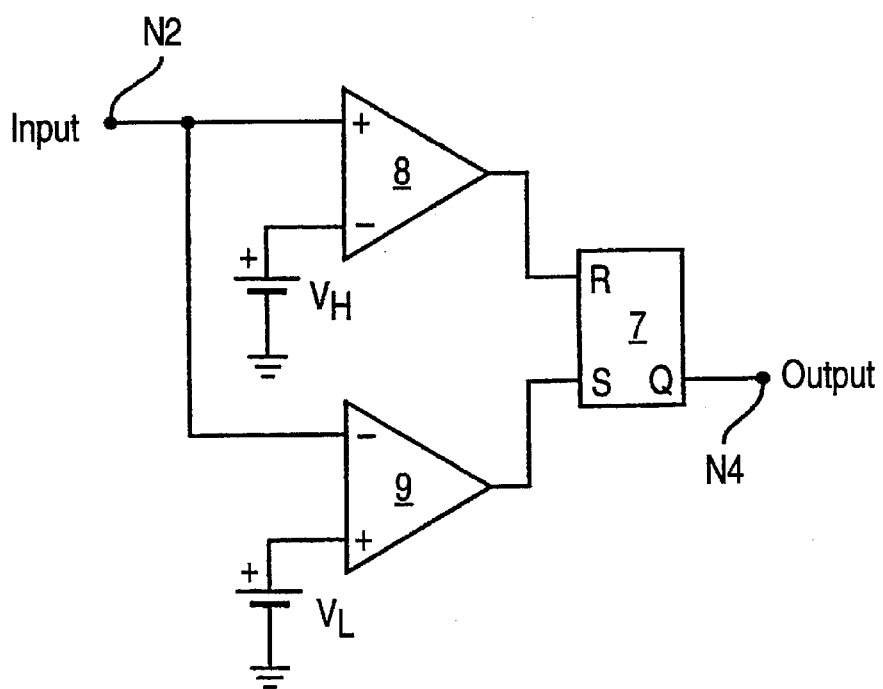
Figure 4C:
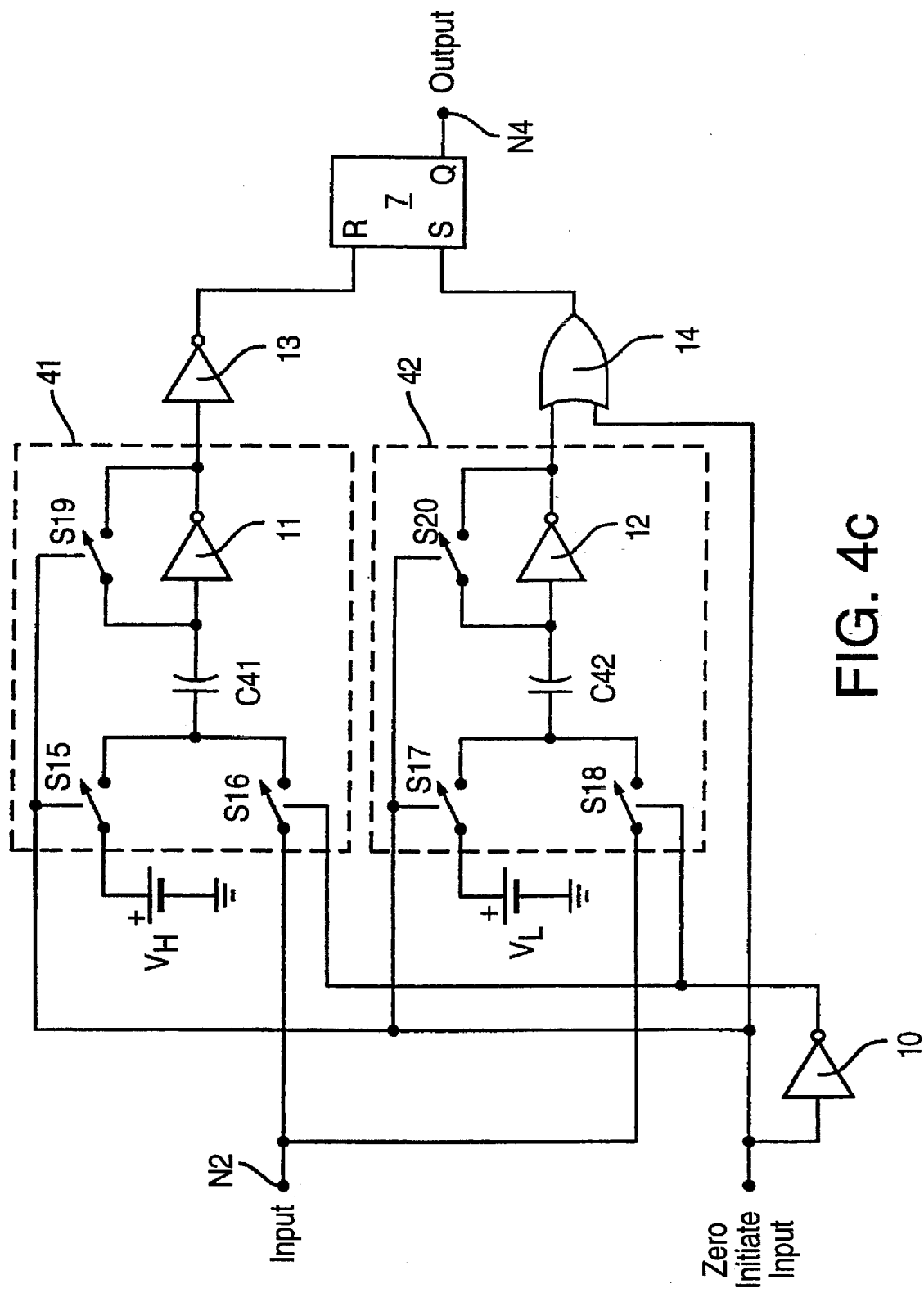

The voltage measuring function performed by Schmitt Trigger 4 in FIG. 1a may be alternatively performed by, for example, one or more comparators having an input connected to node N2. More particularly, FIGS. 4a, 4b and 4c illustrate alternative circuitry for use in magnetometer circuit 1. In FIG. 4a, a Schmitt Trigger, which is implemented using comparator 6 with positive feedback, via resistor R41 which is connected between the output of comparator 6 and the noninverting input of comparator 6, is used to provide the hysteresis for the voltage sensor device. The inverting input of comparator 6 is connected to node N2, and the output of comparator 6 is provided at node N4, these two having corresponding locations in magnetometer circuit of FIG. 1a. A voltage divider utilizing supply voltage +V and resistors R42 and R43, the voltage tap of which is connected to the noninverting input of comparator 6, completes the Schmitt Trigger. The supply voltage +V, the comparator output voltages, and the resistor divider network comprised of resistors R41, R42 and R43 set the high and low threshold voltages.

In FIG. 4b, two comparators, 8 and 9, two voltage references, $V_H$ and $V_L$, and a latch, implemented by RS flip-flop, are used to perform the same function as inverting Schmitt Trigger 4 in FIG. 1a. In the circuit of FIG. 4b, node N2 of sensor L is connected to the non-inverting input of comparator 8 and to the inverting input of comparator 9. Voltage reference $V_H$ is connected to the inverting input of comparator 8, which will reset the RS flip-flop output at node N4 when the voltage of node N2 exceeds this high threshold voltage. Reference voltage $V_L$ is connected to the noninverting input of comparator 9, which will set the output at N4 of RS flip-flop 7 high when the voltage at node N2 falls below this low threshold voltage. The inverting property of the Schmitt Trigger is not essential for the operation of the magnetometer shown in FIG. 1a; it should be obvious how to design a logically equivalent circuit with a non-inverting Schmitt Trigger. Similarly, with the Schmitt Trigger implementation shown in FIG. 4b, it is possible to design alternative circuits which combine RS flip-flop 7 with D flip-flop 5 of FIG. 1a.

Since the comparators in the implementation of FIG. 4b are used only for a short period during the sampling cycle, these comparators could be implemented using sampled CMOS comparators (shown as 41 and 42 in FIG. 4c). Comparators 41 and 42 are both precharged during an initialization phase when an additional control signal (called Zero Initiate) is set high and applied to the Zero Initiate Input terminal. The operation of the circuit and switches S15–S20 is as follows. The Zero Initiate Signal should be pulsed high for a brief duration, closing switches S15, S17, S19, and S20. In this state, the trip point of comparator 41 is set to $V_H$ as C41 is charged to the voltage difference between $V_H$ and the input midpoint of inverting element 11. Similarly, the trip point of comparator 42 is set to $V_L$ as C42 is charged to the voltage difference between $V_L$ and the input midpoint of inverting element 12. OR gate 14 serves to keep the output of RS latch 7 high during this zeroing phase. During the normal operational phase of the magnetometer, the Zero Initiate signal is lowered to logic low and the input signal at node N2 is effectively coupled via capacitors C41 and C42 to inverting gain elements 11 and 12 respectively. The output of inverting gain element 11 will be low when the voltage at node N2 exceeds the threshold voltage $V_H$, causing the output of inverter 13 to go high and reset latch 7. The output of inverting gain element 12 will be high when the voltage at node N2 falls below threshold voltage $V_L$, setting latch 7. With the exception of the precharge phase initiated by the Zero Initiate signal, the circuit of FIG. 4c behaves identically to the circuit of FIG. 4b.

Figure 2:
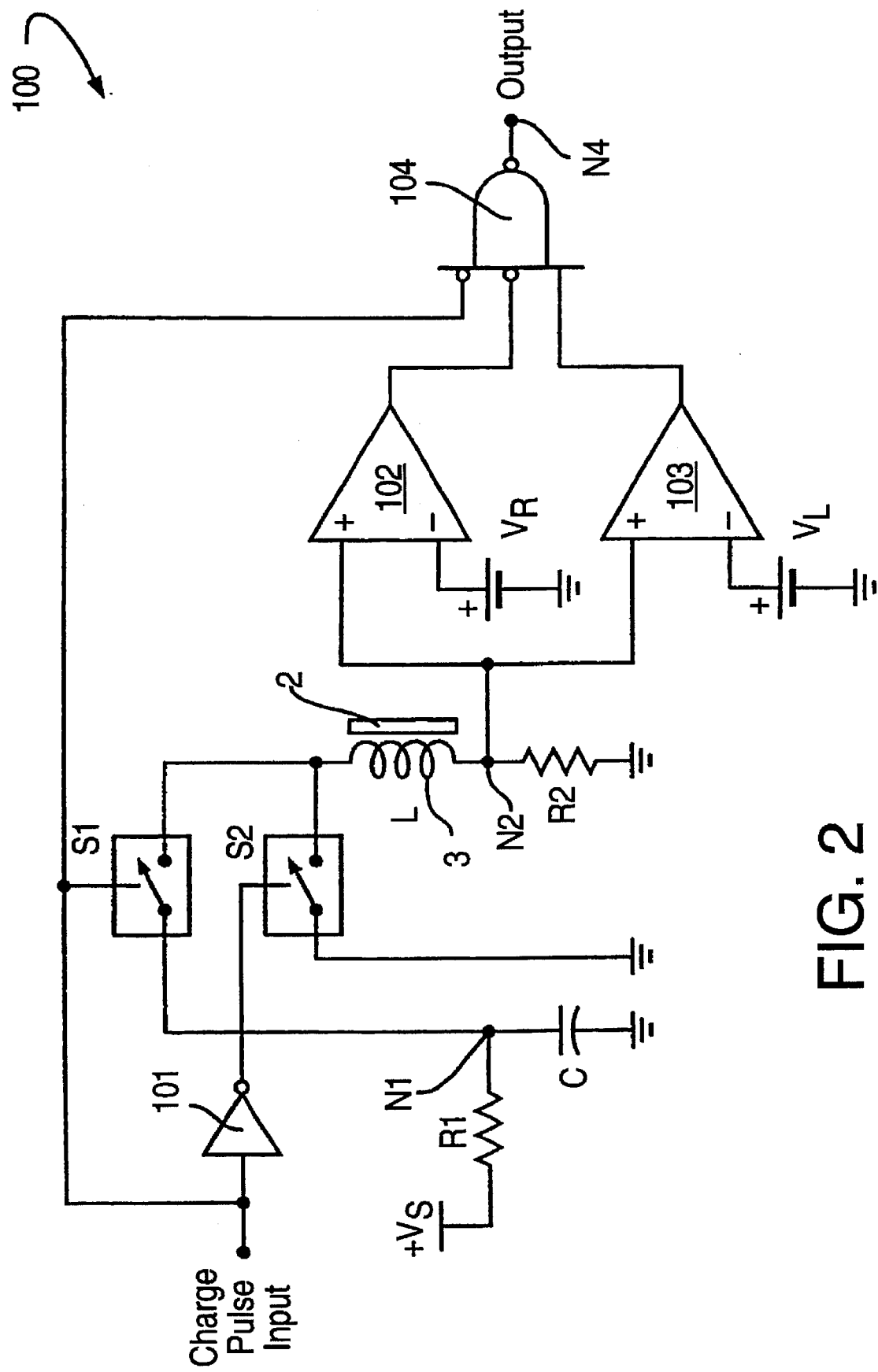
FIG. 2 illustrates a magnetometer circuit according to another embodiment of the present invention.

The Magnetometer circuit 1 shown in FIG. 1a has the two basic operational phases: first, a charging phase, in which the sensor inductor L is charged to a current that meets or exceeds the high threshold current value $I_H$, and second, a discharge phase, in which the sensor is discharged primarily through resistive elements, and where the time between the sensor current starting at the high threshold current $I_H$ until reaching low threshold current value $I_L$ reflects the value of the applied magnetic field. The benefit of making the sensor inductor L discharge through resistive elements is that the sensor's operating point is only a function of the resistance value and the threshold values. The charging phase is not as critical as the discharge phase for the measurement of the magnetic field. As a consequence, many different types of charging circuitry can be substituted for the circuitry shown in FIG. 1a. For the first or charging phase, note that it is not necessary that the current in the sensor be brought to be exactly $I_H$. Magnetometer circuit 100 in FIG. 2 gives an example of an alternate circuit in which the sensor current is allowed to exceed the high current threshold $I_H$. In some applications it might be desirable to exceed this high threshold current value to help minimize the undesirable effects of the core material's hysteresis. The magnetometer circuit 100 in FIG. 2 shares many common elements with the circuit 1 of FIG. 1a. The D flip-flop 5 of FIG. 1a is largely eliminated in FIG. 2 and a Charge Pulse input signal controls the state of switches S1 and S2 directly. Inverter 101 functions to alternatively activate the switches S1 and S2. Schmitt Trigger 4 in FIG. 1a is replaced in FIG. 2 by two comparators 102 and 103, gate 104, and two voltage references $V_H$ and $V_L$. These elements in FIG. 2 comprise a window comparator which produces a low output pulse while the voltage at node N2 is between $V_H$ and $V_L$. An additional input to gate 104 from the Charge Pulse input serves to disable the output during the charging phase of the sampling cycle. The Charge Pulse input in FIG. 2 must be supplied to the magnetometer circuit much like the similar Initiate Cycle signal in FIG. 4a except that the pulse width of the Charge Pulse signal must be chosen such that the charging period is long enough to allow the current in sensor L to rise to at least $I_H$ over all variation in operating conditions. This differs from the edge-triggered Initiate Cycle input in FIG. 1a.

Figure 5:
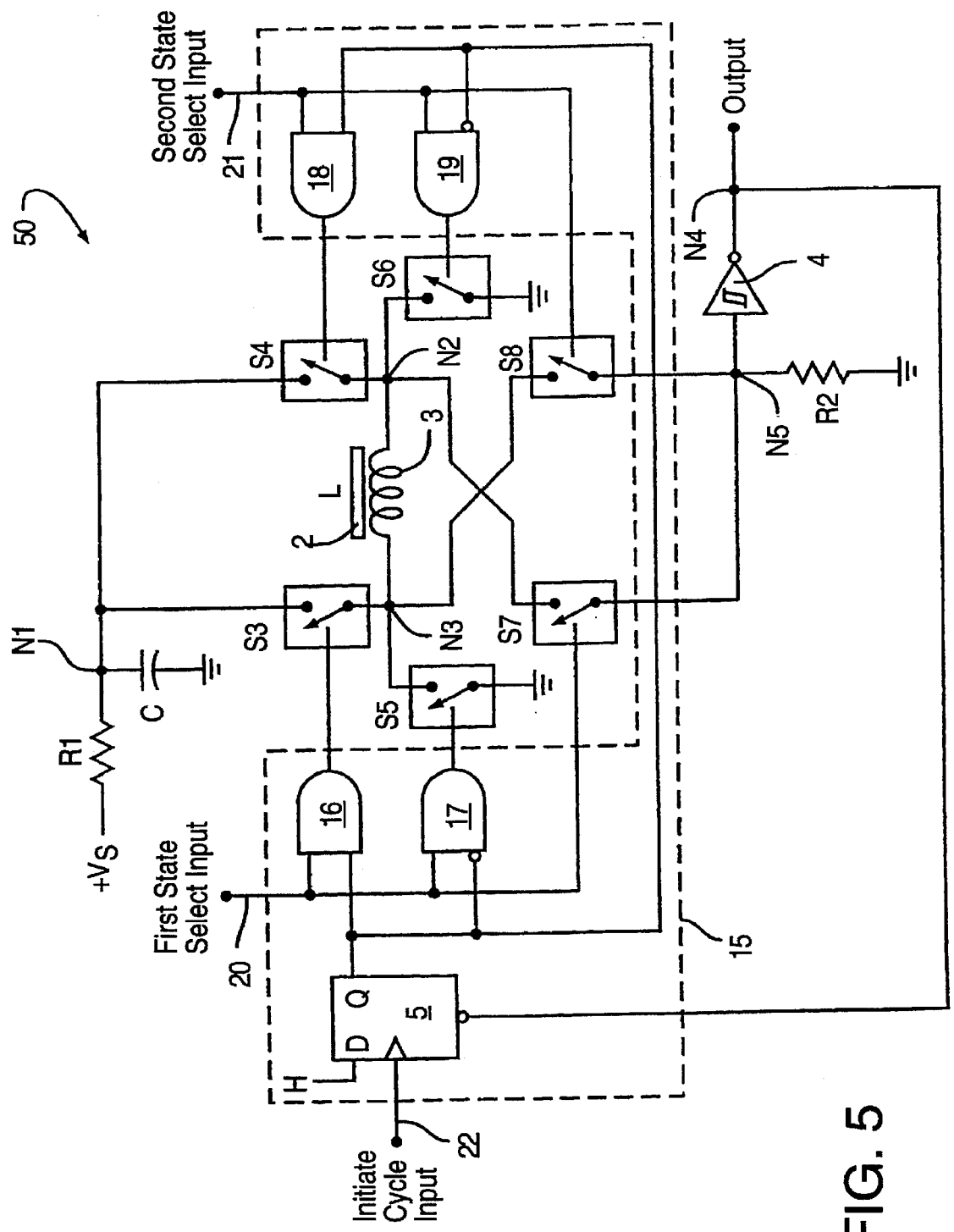
FIG. 5 illustrates another embodiment of the present invention utilizing zero cancellation.
Figure 6:
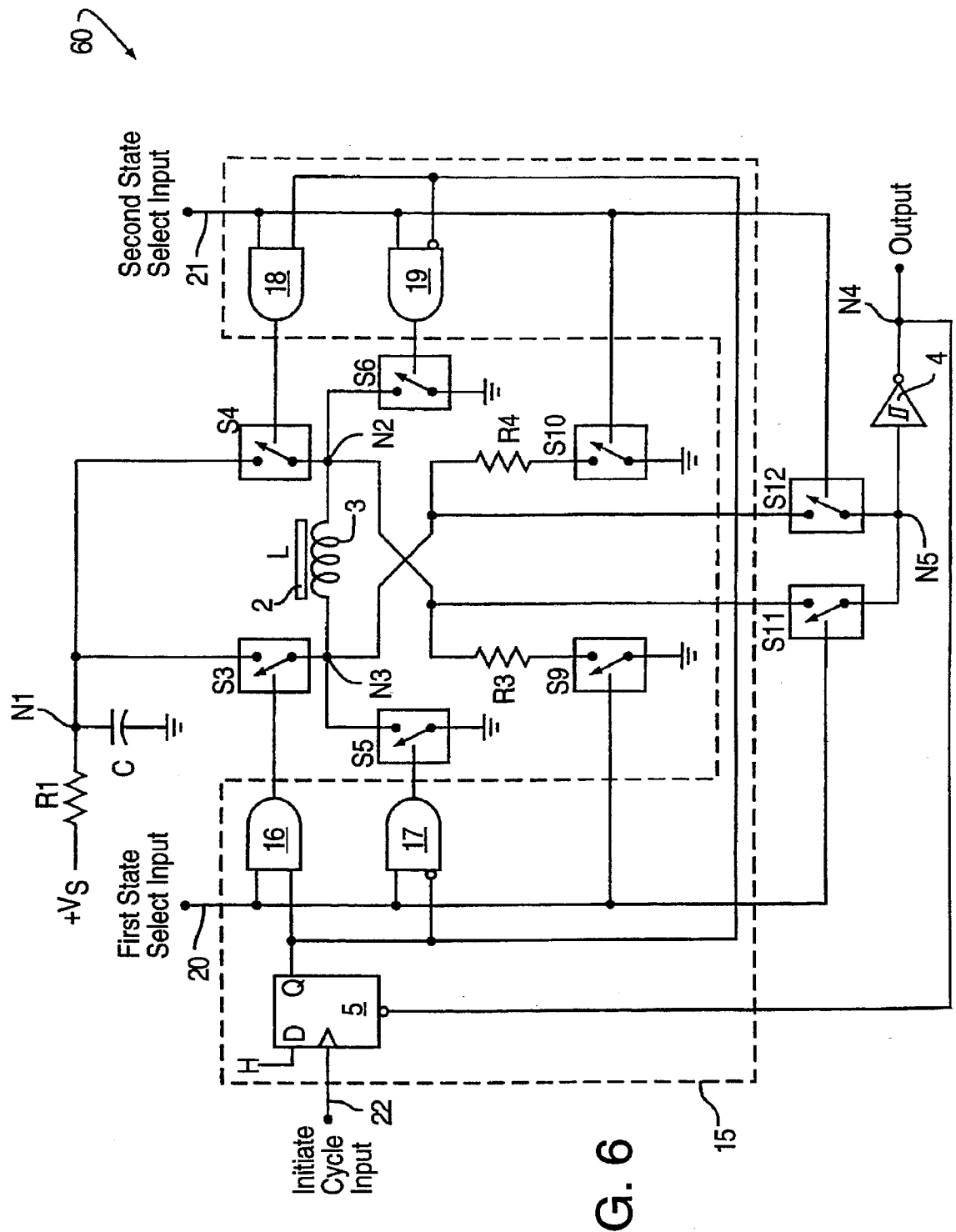
FIG. 6 illustrates a further embodiment of the present invention utilizing zero cancellation.
Figure 7:
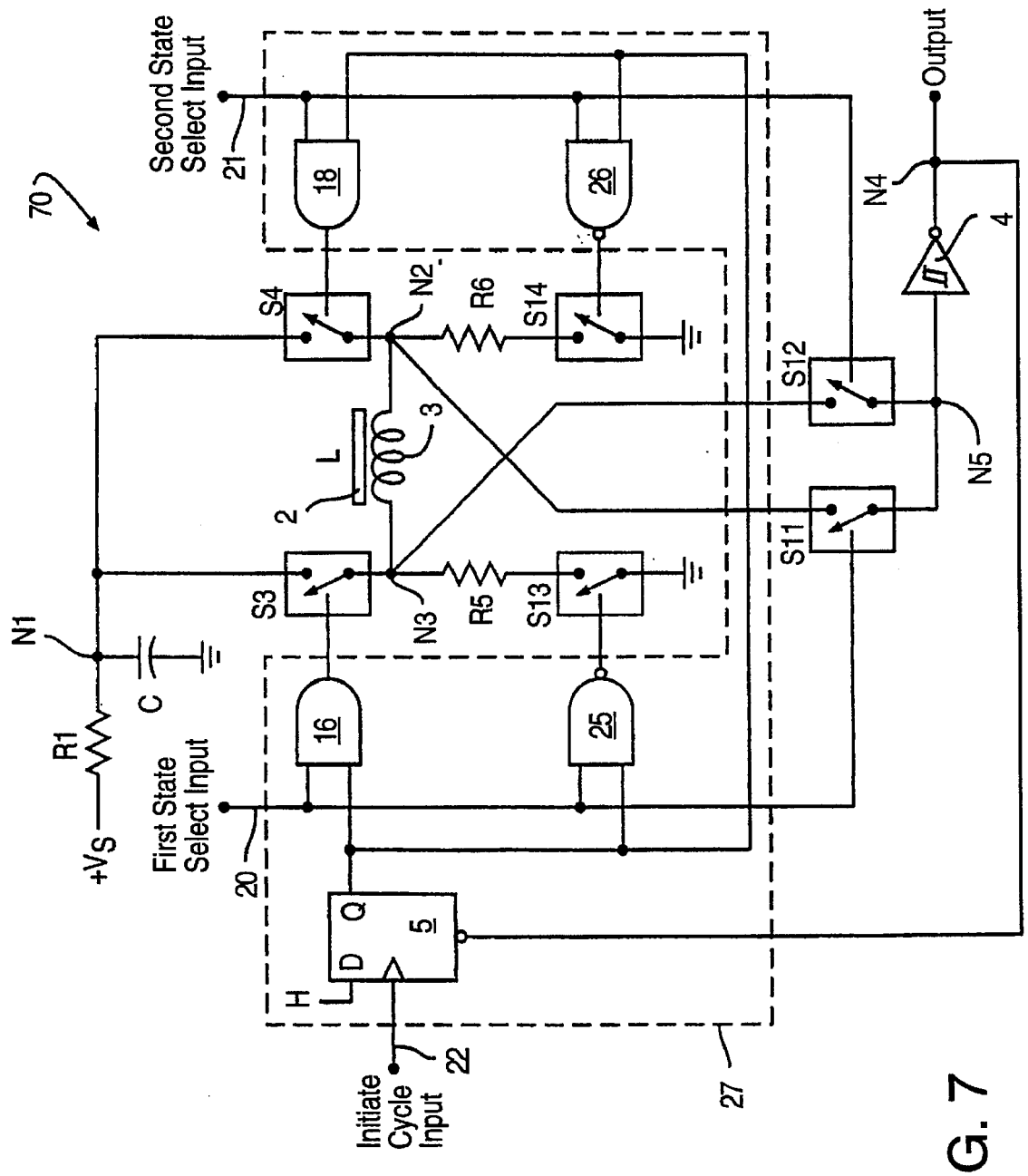
FIG. 7 illustrates yet another embodiment of the present invention utilizing zero cancellation.

While the magnetometer circuits 1 and 100 shown in FIGS. 1a and 2, respectively do meet most of the needs of a low power system, the circuits illustrated in FIGS. 5–7 provide improved performance. For stable measurements, the magnetometer and sensor should ideally produce little or no output variation with temperature. In practice, magnetometer circuit 1 and magnetometer circuit 100 will not be adequate for many applications due to poor temperature performance. In compass applications, it is most critical to have readings which have stable "zero" values; that is, the magnetometer output reading with no applied magnetic field should be repeatable. While the circuit of FIG. 1a might not easily provide this characteristic, simple modifications can yield circuits that have low zero-offsets which are primarily a function of the quality of the circuitry. Magnetometer circuit 50 illustrated in FIG. 5, magnetometer circuit 60 illustrated in FIG. 6 and magnetometer circuit 70 illustrated in FIG. 7 provide zero-offset compensation to provide improved performance over magnetometer circuit 1 illustrated in FIG. 1a. It is readily apparent how the circuit enhancements of FIGS. 5 through 7 can be applied to the magnetometer of FIG. 2 to achieve a similar improvement in zero-offset performance. The details of circuits 50, 60 and 70, and their operations will be described fully below.

Much like typical fluxgate magnetometers, the zero-offset compensation circuits illustrated in FIGS. 5–7 exploit the symmetry of the permeability curve, which can be expressed as follows:

$$\mu(H) = \mu(-H) \qquad (10)$$

Sensor core 2 will possess this symmetry property independent of temperature and despite most sensor manufacturing defects. If the circuit can take a sample on each side of the permeability curve, then the pulse widths from the respective samples can be subtracted to obtain a reading which has virtually no zero-offset. These two different, but symmetric, samples can be achieved by effectively swapping the connections of the sensor to the magnetometer circuit between samples. An external magnetic field that decreases the pulse width during the first sample will, during the second, increase the pulse width. The difference of the two pulse widths will reflect twice the deviation from the zero value of a single sample.

While the sensor connections to the circuit can be swapped directly with the aid of analog switches, this implementation may not produce the best results with the available circuit technology. Magnetometer 50 circuit shown in FIG. 5 is the probably the most straightforward version of the low power magnetometer that provides zero-offset compensation. In magnetometer circuit 50, certain of the circuitry is the same as that used in magnetometer circuit 1, and where there is a commonalty a common reference character is utilized for the respective element. To achieve the zero-offset compensation, the charge-discharge cycle through inductor L is provided by in one state providing a respective charge and discharge of inductor L through node N3, and in a second state a charge and discharge of node N2 of sensor L. To achieve the zero offset operation, bidirectional control circuit 15, indicated within the dashed lines of FIG. 5, provides controls to operate switches S3, S4, S5, S6, S7 and S8 in a manner described below. In addition to D flip-flop 5, bidirectional control circuit 15 includes AND gates 16, 17, 18 and 19. Before a sample is initiated, one of either the First State Select or the Second State Select lines, 20 and 21 respectively, is set high and the other of the lines is set low. These inputs are used to select one of the two circuit states under which samples are taken. In the case where the First State Select line 20 is set high and the Second State Select line 21 is set low, analog switch S7 is closed and analog switch S8 is open. When a rising edge on the Initiate Cycle line 22 sets the D flip-flop 5, analog switch S3 is turned on, charging the sensor L via capacitor C. The current through the sensor L also flows through the sense resistor R2 via analog switch S7. When the voltage across R2 reaches $V_H$, the output of Schmitt Trigger 4 goes low, resetting the D flip-flop 5. Subsequently, analog switches S3 and S5 are opened and closed, respectively, forcing the sensor L to be discharged to ground. When the voltage across R2 drops to $V_L$, the output of Schmitt Trigger 4 returns high. As a result of the circuit's symmetry, the process of taking a sample of the opposite polarity (i.e. with the Second State Select high and the First State Select low) is equivalent to the case described above, except that sensor L is electrically reversed in circuit. The quality of the zero-offset is almost exclusively determined by the matching of each analog switch to its symmetrical mate: S5 to S6 and S7 to S8. Since analog switches S3 an S4 play a role only during the charging of sensor L, they have no direct effect on the output pulse width. Provided that analog switch pairs S5-S6 and S7-S8 are well matched and/or have a low on-resistance with respect to the current sense resistor R2, the zero-offset of the magnetometer should be minimized. Using CMOS circuitry, such as in a typical watch application, the analog switches can be implemented using either transmission gates (a complementary pair of MOSFETs) or a single N- or P-channel MOSFET. Analog switches S3 and S4 can be implemented solely with P-channel MOSFETs since the voltage across the capacitor C will be close to the positive supply $V_S$. Similarly, analog switches S5 and S6 each can be implemented with only an N-channel MOSFET, since these switches connect to the ground rail. Analog switches S7 and S8 are best implemented as transmission gates since the signal voltage at the switch nodes N2 and N3 covers a wide range between the supply rails.

In some cases, it might not be possible to achieve adequate matching of the analog switches S7 and S8 in the circuit of FIG. 5 to achieve a low zero-offset. Magnetometer circuit 60 illustrated FIG. 6 avoids this problem by using analog switches (S9 and S10) which are kept close to the ground supply rail. This is achieved, in part, by using two matched current sensing resistors, R3 and R4, in lieu of the single resistor R2 of the previous circuits. Also, two new analog switches, S11 and S12, are introduced, although these can have relatively high on-resistance since they do not have to carry substantial current. One of the primary benefits of magnetometer circuit 60 shown in FIG. 6 is the ability to implement all the critical matched pairs of analog switches (S5-S6 and S9-S10) using N-channel MOSFETs. Since low on-resistance is a clear virtue for these switches, N-channel transistors are the best choice from the standpoint of real-estate. Briefly, magnetometer circuit 60 operates as follows. In a fashion similar to the operation of magnetometer circuit 50, bidirectional control circuit 15 operates such that when first state select line 20 is high and second state select line 21 is low, switches S9 and S11 are closed and resistor R3 functions as the impedance across which a voltage is measured indicating the current flow through sensor L. An Initiate Cycle Signal is provided to initiate cycle line 22 which results in the closing of switch S3 to provide operating potential to sensor L. When the voltage across resistor R3 reaches $V_H$, the output of Schmitt Trigger 4 goes low, resetting D flip-flop 5. Subsequently, analog switches S3 and S5 are opened and closed, respectively, forcing sensor L to discharge to ground. When the voltage across resistor R3 drops to $V_L$, the output of Schmitt Trigger 4 returns high, thus completing a sample. In view of the symmetry of the circuitry, a second sample is obtained using a high input on second state select line 21 and a low input on first state select line 20. In this second state of operation, switches S4, S6, S10 and S12 are utilized to provide a cycle in which node N2 is first powered from capacitor C and then connected to ground through switch S6.

If the area consumed by the four MOSFETs utilized to implement switches S5-S6 and S9-S10 in magnetometer circuit 60 is a significant problem, magnetometer circuit 70 illustrated in FIG. 7 provides another alternative. Magnetometer circuit 70 requires only one carefully matched pair of N-channel MOSFETs for analog switches S13 and S14. This design simplification, in turn, requires two new considerations which must be addressed: 1) each of the low current analog switches S11 and S12 now have to block voltages below ground when they are off, and 2) the values of resistors R5 and R6 now will have to be roughly halved compared to the values used for R3 and R4 in magnetometer circuit 60, requiring a corresponding halving of the Schmitt Trigger thresholds $V_L$ and $V_H$. The first consideration requires that analog switches S11 and S12 have a negative supply below the ground rail, as well as level translation for the control signal. The reduction of the resistance and threshold values is relatively straightforward, although it does increase susceptibility to noise. Overall, magnetometer circuit 70 should be the most economical to implement on silicon using CMOS technology.

In operation, magnetometer circuit 70 utilizes slightly different control circuitry, indicated as bidirectional control circuit 27. Several of the components of bidirectional circuit 27 are common to those of bidirectional circuit 15 illustrated in magnetometer circuits 50 and 60, and accordingly use the same reference character. For magnetometer circuit 70, bidirectional control circuit 27 includes NAND gates 25 and 26, which control switches S13 and S14 respectively. In a first operational state, a high signal is provided on first state select line 20 and a low signal is provided on second select line 21. In the first operational state, switches S3, S11, S13 and S14 are utilized. In this first operational state, node N3 is alternately provided with power from the charge on capacitor C and secondly placed to ground through switch S13 and resistor R5. Throughout this first operational state, resistor R6 and switches S14 and S11 provide the input of Schmitt Trigger 4 with a means to measure the voltage at node N2 and thus the current through sensor L. During the second operational state in which second state select line 21 is high, and first state select line 20 is low, switches S4, S12, S14 and S13 are utilized. In this operational state, node N2 is alternately provided with power from the charge on capacitor C and secondly placed to ground through switch S14 and resistor R6. Throughout this second operational state, resistor R5 and switches S13 and S12 provide the input of Schmitt Trigger 4 with a means to measure the voltage at node N3 and thus the current through sensor L.

While the architecture of magnetometer circuits 1, 50, 60 and 70 are well suited to CMOS circuit technology, other circuit components can be used. Since the performance of the zero offset compensation employed in circuits 50, 60 and 70 relies on the matching of the analog switches, switching components using bipolar or other technologies still must have well matched voltage drops. For instance, if saturating common-emitter NPN transistors are used in lieu of N-channel MOSFETs, the saturation voltage drops of these transistors should be closely matched. In the case of magnetometer circuits 50 and 60 of FIGS. 5 and 6, analog switches S5 and S6 can be implemented by diodes with anodes connected to ground. They will conduct during the discharging of sensor L without requiring any explicit control. Again, the matching of the diodes is important for accuracy; the knee voltages should be well matched. Given the matching requirements, MOSFETs are the presently preferred switching elements. Whereas the on-resistance of MOSFETs can be reduced to make poorly matched transistors have similar voltage drops, there is no comparable option for bipolar switches or diodes.

Figure 8:
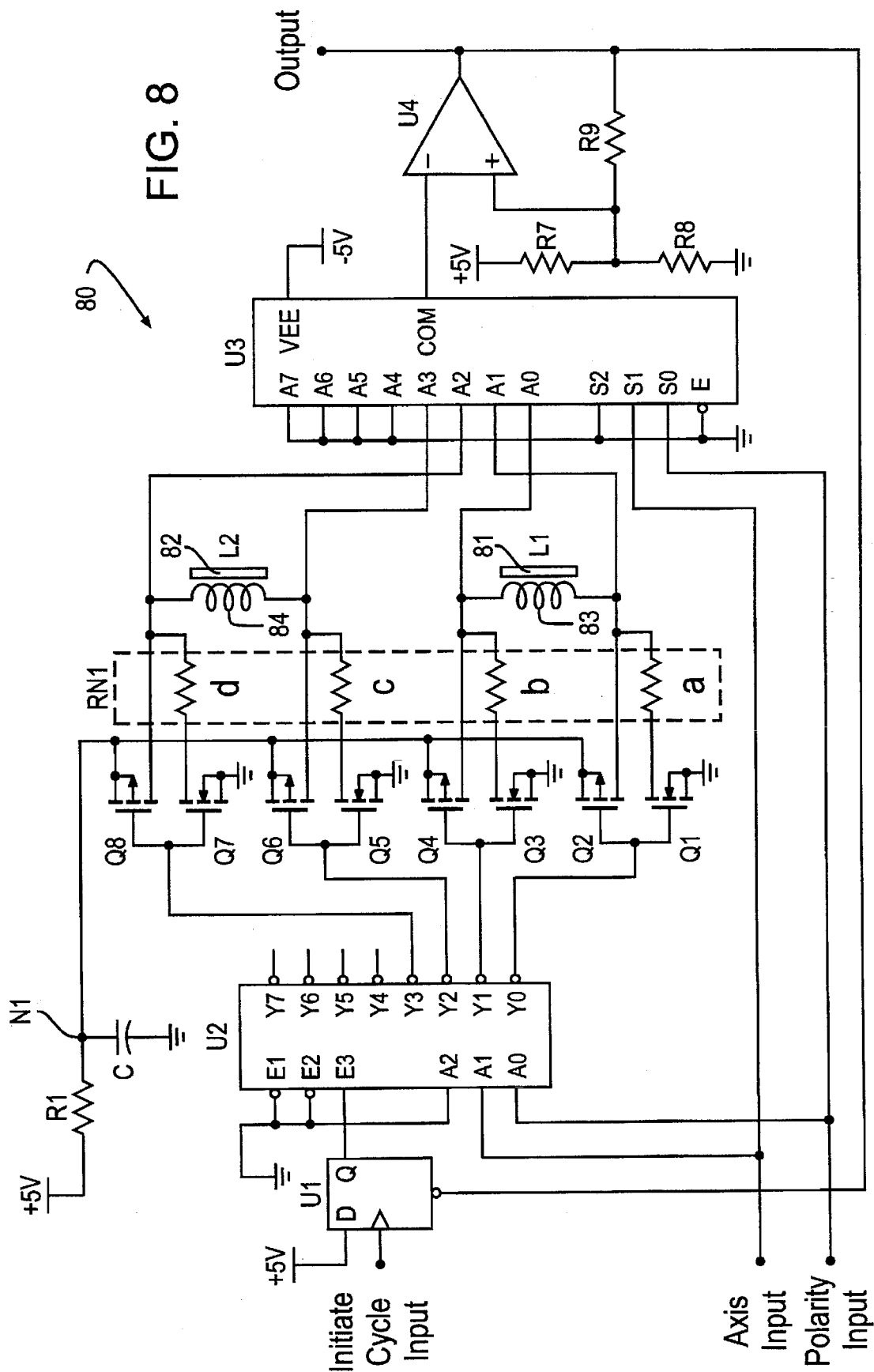
FIG. 8 is a circuit diagram of a magnetometer circuit in accordance with the present invention, in which two sensors are utilized to sense magnetic fields in a first and a second axes.

When using magnetometer circuits in an electronic digital compass, it is necessary to be able to sense magnetic fields on multiple axes. One embodiment of a biaxial circuit is illustrated in FIG. 8 which shows schematically biaxial magnetometer circuit 80. Biaxial magnetometer circuit 80 utilizes for first and second axes, sensors L1 and L2 respectively, and a magnetometer circuit of the type illustrated in FIG. 7. From a physical standpoint, sensors L1 and L2 are located such that their respective cores are oriented at a 90° angle. In biaxial magnetometer circuit 80 of FIG. 8, the current sensor is implemented by comparator U4, with feedback resistor R9 and a voltage divider comprising resistors R7 and R8. Comparator U4 can be a common device such as a National Semiconductor LM311. The MOSFET switches Q1 through Q8 are driven by demultiplexer U2, which may be a 1-to-8 digital demultiplexer such as a standard 74HC138 HCMOS logic device. The outputs of sensors L1 and L2 are switched onto the comparator input by way of U3, an 8-to-1 analog multiplexer such as a standard 74HC4051 HCMOS device. The N-channel MOSFET switches, Q1, Q3, Q5, and Q7, are small signal switching devices such as the VN2222 made by SiliConix. The P-channel MOSFET switches, Q2, Q4, Q6, and Q8, are small signal switching devices such as the VP0610 made by Siliconix. The four resistors in the sensor drive path are implemented as a single resistor network RN1 to ensure that they are well matched; this provides a good way to ensure matching as well as tracking over temperature. Sensors L1 and L2 each include a coil, 83 and 84 respectively. Each of the coils comprises approximately 1000 turns of 40 gauge wire wound about its respective core in a solenoidal fashion. Sensor core material for cores 81 and 82 of L1 and L2, respectively, may be each typically a piece of 2705M amorphous metallic glass foil from Allied Signal. For typical sensitivity and dynamic range the sensor core is 400 mils long by 20 mils wide. In a typical non-tilt-compensated compass application, sensors L1 and L2 will be oriented orthogonal to each other to sense two vector components of the earth magnetic field. Control flip-flop U1 can be implemented by a standard 74HC74 HCMOS logic device.

Biaxial circuit 80 shown in FIG. 8 provides a way of sampling each axis in succession. The magnetometer is intended to be used in conjunction with a microprocessor or other sequential logic that can take a series of samples and, upon digitizing the data, calculate the resulting azimuth. A total of four samples must be taken to acquire data for an azimuth; a sample from each axis of different polarity should be taken. When the Axis input is low, sensor L2 is inactive and sensor L1 is sampled. A low on the Polarity input then allows sensor L1 to be charged with a current through Q2. The current through sensor L1 results in a voltage across resistor RN1$b$, which appears, via analog multiplexer input A0, at the input of comparator U4 (an inverting Schmitt Trigger). During the discharge portion of the cycle, Q2 is turned off and Q1 provides a discharge path to ground for the sensor current. The measurement of the magnetic field in the opposite sense along sensor L1 is accomplished by setting the Polarity input high. A similar pair of opposite polarity samples can be taken from sensor L2 by setting the Axis input high. If 60 Hz magnetic fields are a significant source of noise in the target application, the samples should be timed synchronous to this rate. One possible technique is to take samples of opposite polarity from each axis at $\frac{1}{120}$ of a second intervals. If this sample rate is too fast, the circuit can delay the second sample for any multiple of $\frac{1}{60}$ of a second. The differencing of the samples will cancel out the fundamental component of the interfering 60 Hz field. For example, in magnetometer circuit 70, the second state sample should be initiated $\frac{1}{120}$ of a second after the initiation of the first state sample.

Figure 9A:
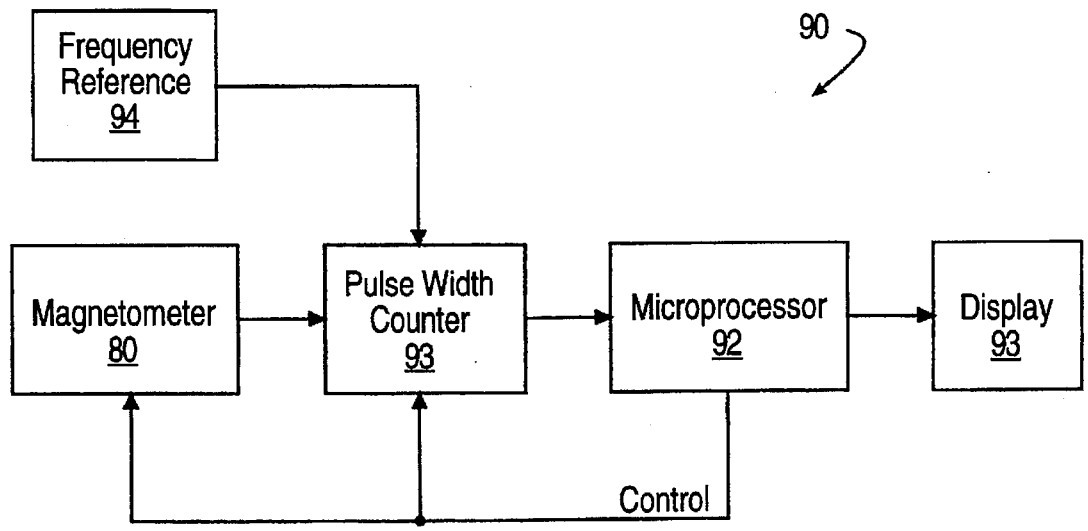
FIGS. 9a and 9b illustrate in block diagram form two electronic compass systems utilizing magnetometer circuits in accordance the present invention.
Figure 9B:
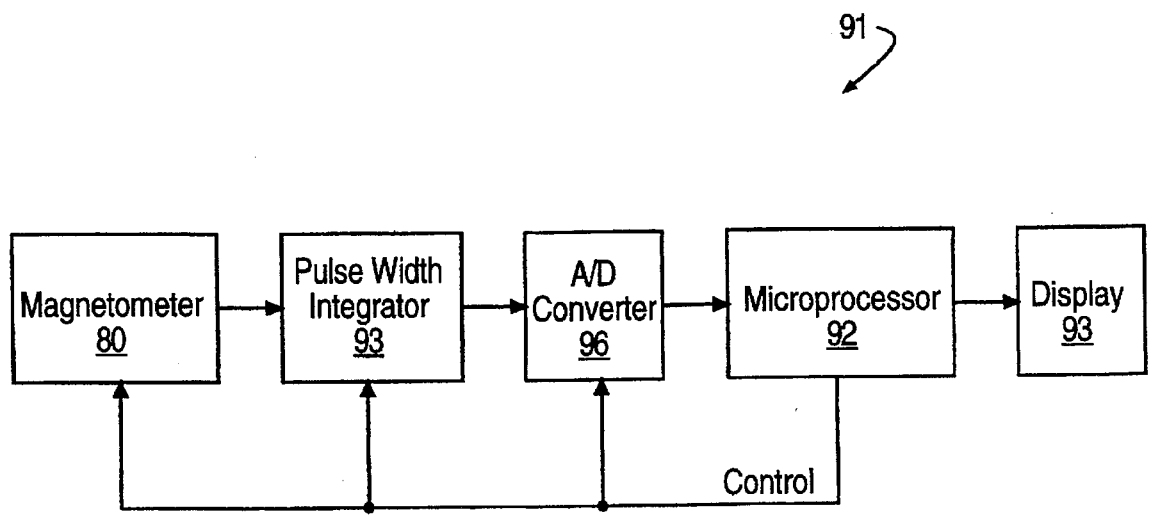

FIGS. 9$a$ and 9$b$ show block diagrams of electronic compass systems 90 and 91, respectively, using the short sample magnetometer in accordance with the present invention. Both are controlled by microprocessor 92, and provide output on a display 93. In system 90 of FIG. 9$a$, the pulse width of the magnetometer output is digitized using a simple counting technique. The pulse input can be used as a gate for pulse width counter 93. Counter 93 is clocked by a stable frequency reference circuit 94, which may be provided by a crystal oscillator. In some applications, the required frequency for this reference might cause excessive power dissipation.

Alternatively, electronic compass system 91, illustrated in FIG. 9$b$ can potentially be a lower power option. The width of the magnetometer's output pulse is digitized by using the output pulse from magnetometer 80 as a gate for analog integrator circuit 95. The output of integrator circuit 95 is provided to A/D converter 96 where it is measured. The gain elements used for the integrator and the A/D converter can both be used intermittently and therefore have a low average power dissipation.

I claim:

1. A magnetometer circuit capable measuring a magnetic field during one switching cycle, said magnetometer circuit comprising:

a sensor coil including a saturable core, said sensor coil having first and second terminals;

a first impedance having first and second terminals;

means connecting said first terminal of said first impedance to said second terminal of said sensor coil and means connecting said second terminal of said first impedance to a ground potential;

a first switch for selectively connecting said first sensor coil terminal to a voltage node for receiving a voltage provided by a voltage source during a first portion of said one cycle;

a second switch for selectively connecting said first sensor coil terminal to said ground potential during a second portion of said one cycle;

a voltage sensor having an input terminal and an output terminal, said voltage sensor providing at said output terminal thereof an output signal of a first magnitude in response to a voltage at said input terminal thereof exceeding a first threshold, and said voltage sensor providing at said output terminal thereof an output signal of a second magnitude in response to said voltage at said input terminal thereof falling below a second threshold;

means connecting said input terminal of said voltage sensor to said second terminal of said sensor coil;

a control circuit having first and second input terminals for receiving input control signals and first and second output terminals for providing control signals;

means connecting said output terminal of said voltage sensor to said first input terminal of said control circuit;

means connecting said first output terminal of said control circuit to said first switch to control operation of said first switch; and means connecting said second output terminal of said control circuit to said second switch to control operation of said second switch.

2. A magnetometer circuit according to claim 1, wherein said voltage sensor comprises a Schmitt trigger.

3. A magnetometer circuit according to claim 1, wherein said voltage sensor comprises a comparator.

4. A magnetometer circuit according to claim 1, wherein said control circuit comprises a D flip-flop.

5. A magnetometer circuit according to claim 1, wherein said voltage sensor comprises first and second comparators and an RS flip-flop.

6. A magnetometer circuit according to claim 1, further comprising a capacitor having first and second terminals, said first capacitor terminal connected to said voltage node and said second capacitor terminal connected to said ground potential, a second impedance having first and second terminals, means connecting said first terminal of said second impedance to said voltage source, and means connecting said second terminal of said second impedance to said voltage node.

7. A magnetometer circuit according to claim 1, further comprising means connecting a first terminal of said voltage source to said voltage node and means connecting a second terminal of said voltage source to ground potential.

8. A magnetometer circuit according to claim 7, wherein said voltage sensor comprises a Schmitt trigger and said control circuit comprises a D flip-flop.

9. A magnetometer circuit capable of measuring a magnetic field during a single switching cycle, said magnetometer circuit comprising:

a sensor coil including a saturable core, said sensor coil having first and second terminals;

a first switch for selectively connecting said first sensor coil terminal to a power supply during a first portion of said switching cycle;

a second switch for selectively connecting said first sensor coil terminal to ground potential during a second portion of said switching cycle;

a current sensor for measuring current flow through said sensor coil, said current sensor having an input terminal and an output terminal;

means coupling said input terminal of said current sensor to said second terminal of said sensor coil to provide a path for current flow through said sensor coil to ground potential and to permit measurement by said current sensor of current flow through said sensor coil; and circuitry for controlling said first and second switches in said switching cycle such that during said first portion of said switching cycle a connection between said second terminal of said sensor coil and ground potential is maintained through said current sensor and said first switch connects said power supply to said first sensor coil terminal, and during said second portion of said switching cycle a connection between said second terminal of said sensor coil and ground potential is maintained through said current sensor and said second switch connects said first coil terminal to ground potential, wherein said current sensor provides at the output terminal of said current sensor a first output signal in response to the current through the sensor coil achieving a first threshold level, and said current sensor provides at the output terminal of said current sensor a second output signal in response to the current through the sensor coil decreasing to a second threshold level.

10. A magnetometer circuit according to claim 9, wherein said current sensor is comprised:

an impedance having a first terminal connected to said second terminal of said sensor coil and a second terminal connected to said ground potential;

a Schmitt trigger having an input terminal and an output terminal, and wherein said magnetometer circuit includes means connecting said input terminal of said Schmitt trigger to said second terminal of said sensor coil.

11. A magnetometer circuit according to claim 9, wherein said current sensor is comprised of an impedance having a first terminal connected to said second terminal of said sensor coil and a second terminal connected to ground potential; and a comparator having an input terminal and an output terminal, and wherein said magnetometer circuit includes means connecting said input terminal of said comparator to said second terminal of said sensor coil.

* * * * *